United States Patent [19]

Chadwick

[11] Patent Number: 5,159,280
[45] Date of Patent: Oct. 27, 1992

[54] TRUE LOGARITHMIC AMPLIFIER HAVING A VARIABLE GAIN AMPLIFIER

[75] Inventor: Peter E. Chadwick, Wiltshire, England

[73] Assignee: The General Electric Company, plc, England

[21] Appl. No.: 666,359

[22] Filed: Mar. 8, 1991

[30] Foreign Application Priority Data

Mar. 9, 1990 [GB] United Kingdom ............. 9005353.9

[51] Int. Cl.$^5$ ........................ G06G 7/12; G06G 7/24
[52] U.S. Cl. .................................. 328/145; 307/492; 307/494
[58] Field of Search ............... 328/145; 307/492, 493, 307/494, 497

[56] References Cited

U.S. PATENT DOCUMENTS

| 3,061,789 | 10/1962 | Mace | 307/492 |
|---|---|---|---|
| 3,668,535 | 6/1972 | Lansdowne | 328/145 |
| 4,853,564 | 8/1989 | Smith et al. | 307/492 |
| 4,933,641 | 6/1990 | Hsiung et al. | 307/492 |
| 4,980,584 | 12/1990 | Goff et al. | 328/145 |
| 5,012,140 | 4/1991 | Bateman | 307/492 |
| 5,049,829 | 9/1991 | Garskamp | 307/492 |

Primary Examiner—Eugene R. LaRoche
Assistant Examiner—Michael B. Shingleton
Attorney, Agent, or Firm—Kirschstein, Ottinger, Israel & Schiffmiller

[57] ABSTRACT

A true logarithmic amplifier including a gain controlled amplifier having an RF signal input and a gain control input and a successive detection logarithmic amplifier having an RF signal input and a video output connected to the gain control input.

3 Claims, 1 Drawing Sheet

1

TRUE LOGARITHMIC AMPLIFIER HAVING A VARIABLE GAIN AMPLIFIER

BACKGROUND OF THE INVENTION

1. Field of the Invention

The invention relates to a true logarithmic amplifier.

2. Description of Related Art

The architecture of true logarithmic amplifiers has for many years consisted of parallel limiting amplifiers 11 and linear amplifiers 12, as shown in FIG. 1. This method provides compression of the input dynamic range and typically the gain of the limiting amplifier is about 10 dB, which provides a reasonable compromise between the conflicting requirements of maximum dynamic range for any given number of stages, and accuracy. The parameters of low and high level gains and limiting level are required to be stable with temperature. Finally, the response time of this is very small, and it is possible to see logarithmic action from cycle to cycle of the input signal providing that the amplifier bandwidth is adequate.

This method has some difficulties in its implementation especially in integrated circuits. Because the linear amplifier must supply the full output swing at the output of a multi-stage amplifier, and it is uneconomic to produce different integrated circuits for each stage, the circuits produced are capable of producing a large output voltage and this requires the power consumption to be increased to cater for this. Further, true logarithmic amplifiers have been used in applications where variations in transmitted signal phase with input signal level must be minimised, and maintenance of this performance requires extremely wide amplifier bandwidth.

SUMMARY OF THE INVENTION

According to the invention there is provided a true logarithmic amplifier including a gain controlled amplifier having an RF signal input and a gain control input and a successive detection logarithmic amplifier having an RF signal input and a video output connected to the gain control input.

In one embodiment said successive detection logarithmic amplifier is connected in cascade with said gain control amplifier such that its RF input is arranged to receive the RF signal and its RF limited output is connected to the RF signal input of the gain controlled amplifier.

In another embodiment the RF input of said gain control amplifier is arranged to receive directly said RF signal.

BRIEF DESCRIPTION OF THE DRAWINGS

The invention will now be further described by way of example with reference to the accompanying drawings in which.

DETAILED DESCRIPTION OF THE PREFERRED EMBODIMENTS

Figure 2:
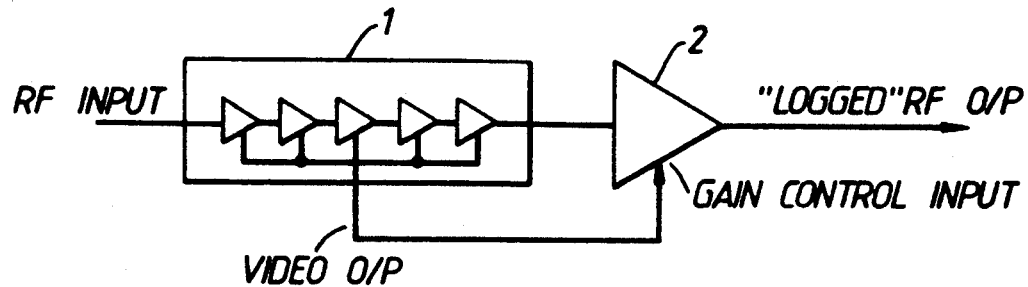
FIG. 2 illustrates an amplifier providing true log characteristics according to the invention; and, FIG. 3 illustrates an alternative embodiment of the present invention.

In the amplifier illustrated in FIG. 2, a successive detection logarithmic amplifier (1) feeds its outputs to a gain controlled amplifier (2). The outputs consist of the signal related to the amplitude of the RF signal at the input of the successive detection logarithmic amplifier, and the output at RF of the limiting amplifiers contained within the logarithmic amplifier. NOTE: that where the successive detection logarithmic amplifier shows little or no change in transmission phase with varying input level, thre advantage of the true log in this respect is diminished.

The gain controlled amplifier (2) is an amplifier arranged such that increase in the video output of the successive detection logarithmic amplifier (1) causes an increase in the gain of the amplifier (2) thus varying the amplification of the limited signal output in sympathy with the input level.

Thus the RF voltage swing required at the output of such an amplifier is not required in the previous stages of the strip, which reduces the power requrirements in the earlier stages.

The bandwidth and response time of such a system is limited by the capabilities of the successive detection amplifier video and RF bandwidths, and the performance of the gain controlled amplifier. Additionally, the output spectrum of system will be different, but especially where band pass filters precede and succeed the amplifier, the spectrum will be modified substantially.

Figure 1:
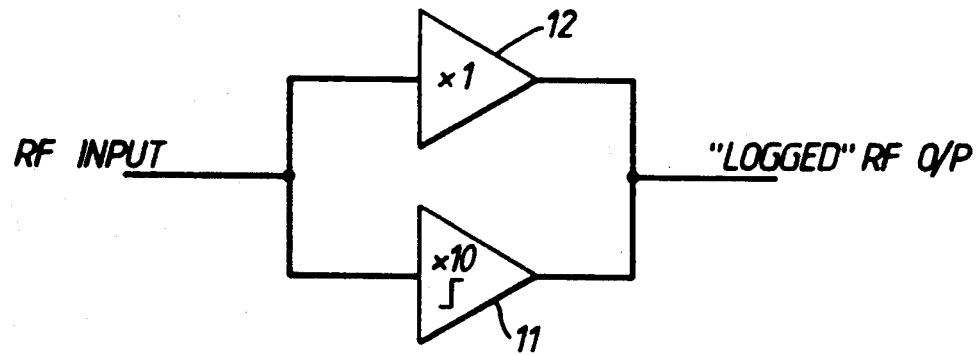
FIG. 1 illustrates a true logarithmic amplifier according to the prior art.
Figure 3:
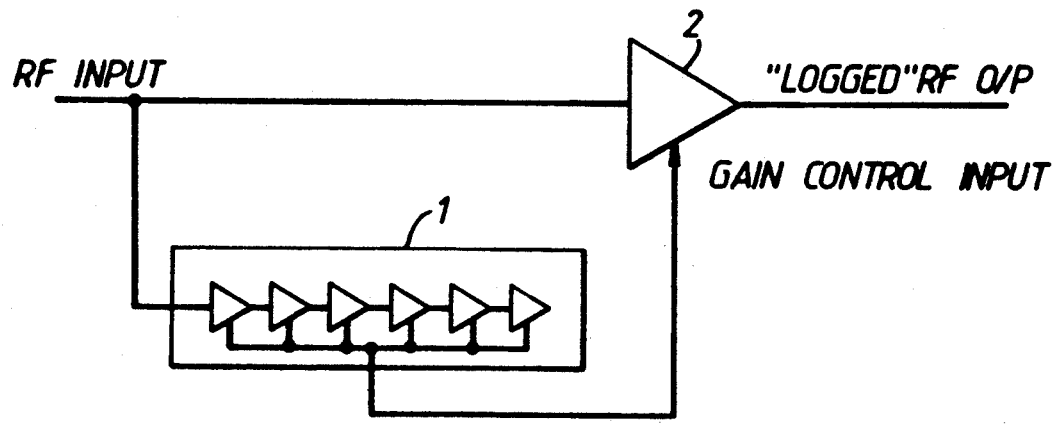

A further advantage is that the transfer characteristic slope can be readily adjusted to any desired value, and the accuracy is dependent upon the maintenance only of the output limiting stage level of the successive detection logarithmic amplifier in edition to the accuracy of the successive detection logarithmic amplifier and gain controlled amplifier.

Where the departure from the approximated true log law produced by the ampifer of FIG. 1 is critical, a further version shown in FIG. 3 may be used.

Here, to obtain any given dynamic range D dB, the amplifier must be capable of being varied in gain by D dB. As the amplifier is a linear amplifier it produces a lower degree of in band intermodulation products than a limiting amplifier.

I claim:

1. A true logarithmic amplifier arrangement comprising an RF input terminal and an RF output terminal, a gain ocntrolled linear RF amplifier having an RF signal input, an RF signal output and a gain control input, a successive detection logarithmic amplifier having an RF signal input and a video signal output, means connecting the RF input terminal of the arrangement to the RF signal input of said logarithmic amplifier, means connecting the RF signal output of the gain controlled amplifier to the RF output terminal of the arrangement, and means connecting the video signal output of said logarithmic amplifier to the gain control input of said gain controlled amplifier.

2. A true logarithmic amplifier arrangement comprising an RF input terminal and an RF output terminal, a gain controlled linear RF amplifier having an RF signal input, an RF signal output and a gain control input, a successive detection logarithmic amplifier having an RF signal input, an RF signal output and a video signal output, means connecting the RF input terminal of the arrangement to the RF signal input of said logarithmic amplifier, means connecting the RF signal output of said logarithmic amplifier to the RF signal input of said gain controlled amplifier, means connecting the RF signal output of the gain controlled amplifier to the RF output terminal of the arrangement, and means connecting the video signal output of said logarithmic amplifier to the gain control input of said gain controlled amplifier.

3. A true logarithmic amplifier arrangement comprising an RF input terminal and an RF output terminal, a gain controlled linear RF amplifier having an RF signal input, an RF signal output and a gain control input, a successive detection logarithmic amplifier having an RF signal input and a video signal output, means connecting the RF input terminal of the arrangement to the RF signal inputs of the gain controlled amplifier and the logarithmic amplifier, means connecting the RF signal output of the gain controlled amplifier to the RF output terminal of the arrangement, and means connecting the video signal output of the logarithmic amplifier to the gain control input of the gain controlled amplifier.

* * * * *